United States Patent [19]
Bronner et al.

[11] Patent Number: 6,034,877
[45] Date of Patent: Mar. 7, 2000

[54] SEMICONDUCTOR MEMORY ARRAY HAVING SUBLITHOGRAPHIC SPACING BETWEEN ADJACEMENT TRENCHES AND METHOD FOR MAKING THE SAME

[75] Inventors: Gary Bela Bronner; Jack Allan Mandelman, both of Stormville; Donald James Samuels, Yorktown Heights, all of N.Y.

[73] Assignee: International Business Machines Corporation, Armonk, N.Y.

[21] Appl. No.: 09/093,902

[22] Filed: Jun. 8, 1998

[51] Int. Cl.[7] .................................................. G11C 11/24
[52] U.S. Cl. .............................. 365/51; 365/149; 365/63
[58] Field of Search ................................ 365/51, 63, 149

[56] References Cited

U.S. PATENT DOCUMENTS

| | | | |
|---|---|---|---|
| 4,803,535 | 2/1989 | Taguchi .................................. | 357/23.6 |
| 5,264,716 | 11/1993 | Kenney .................................... | 257/301 |
| 5,296,729 | 3/1994 | Yamanaka et al. ...................... | 257/377 |
| 5,298,775 | 3/1994 | Ohya ....................................... | 365/149 |
| 5,342,713 | 8/1994 | Ohtsuka et al. ......................... | 430/5 |
| 5,360,758 | 11/1994 | Bronner et al. ......................... | 437/52 |
| 5,442,211 | 8/1995 | Kita ........................................ | 257/301 |
| 5,488,242 | 1/1996 | Sunouchi et al. ...................... | 257/301 |
| 5,508,541 | 4/1996 | Hieda et al. ............................ | 257/301 |
| 5,512,767 | 4/1996 | Noble, Jr. ............................... | 257/301 |
| 5,514,499 | 5/1996 | Iwamatsu et al. ..................... | 430/5 |
| 5,521,407 | 5/1996 | Kohyama et al. ...................... | 257/301 |
| 5,538,815 | 7/1996 | Oi et al. ................................. | 430/5 |
| 5,555,520 | 9/1996 | Sudo et al. ............................. | 365/149 |
| 5,583,069 | 12/1996 | Ahn et al. ............................... | 437/52 |
| 5,614,431 | 3/1997 | Debrosse ................................. | 437/52 |
| 5,700,731 | 12/1997 | Lin et al. ................................ | 438/381 |

FOREIGN PATENT DOCUMENTS 1222472  9/1989  Japan .

OTHER PUBLICATIONS

UK Patent Application GB2293026A, "Phase Shift Mask", Application No. 9518316.6, filed Jul. 9,1995.
Levenson, et al., "Improving Resolution in Photolithography with a Phase–Shifting Mask", IEEE Transactions on Electron Devices, vol. ED–29, No. 12, Dec. 1982.
T. Hamamoto, et al., "Well Concentration: A Novel Scaling Limitation Factor Derived from DRAM Retention Time and Its Modeling", IEEE, 1995, pp. 36.4.1–36.4.4.
I. Yang, et al., "Fabrication of back–gated complementary metal–oxide semiconductor devices using mixed and matched optical and x–ray lithographies", J. Vac. Sci. Technol. B 14(6), Nov./Dec. 1996, pp. 4024–4028.
T. Ozaki, et al., "0.228um2 Trench Cell Technologies with Bottle–Shaped Capacitor for 1Gbit DRAMs", 1995 IEEE, pp. 27.3.1–27.3.4.
J. Colinge, et al., "Silicon–On–Insulator Gate–All–Around– –Device", 1990 IEEE, pp. 25.4.1–25.4.4.

*Primary Examiner*—Terrell W. Fears
*Attorney, Agent, or Firm*—Daryl K. Neff, Esq.

[57] ABSTRACT

Disclosed herein is an arrangement of memory cells in which the spacing between back-to-back trench capacitors is defined at less than 1 F spacing. A pure phase edge mask is used to define such trench patterns having less than 1 F spacing. The reduction in the trench-to-trench spacing results in increased separation between the trench and the near edge of the gate conductor. This increase in the trench to gate conductor spacing, in turn, permits the channel doping concentration to be decreased, with a corresponding increase in ON current to be realized. In alternative embodiments, a pure phase edge mask or a blocked phase edge mask can be used to define trench patterns in which the width of trenches is increased to form storage capacitors having higher capacitance. In such embodiments, the spacing between back-to-back trenches can be reduced, such that the total separation between the outer edges of adjacent trenches is maintained at about 3 F or less.

14 Claims, 8 Drawing Sheets

P.E. DIFFUSED
FIG. 8

BLOCKED PHASE EDGE

FIG. 9

SEMICONDUCTOR MEMORY ARRAY HAVING SUBLITHOGRAPHIC SPACING BETWEEN ADJACEMENT TRENCHES AND METHOD FOR MAKING THE SAME

FIELD OF THE INVENTION

This application relates to the arrangement of device elements within a semiconductor memory array and a method of making the same.

BACKGROUND OF THE INVENTION

An obstacle to the reduction of cell size in DRAM arrays is high channel doping concentrations that are required to achieve the required off current ($I_{off}$) objective with existing DRAM cell designs. This problem will be discussed in relation to a common existing DRAM cell design known as MINT (merged isolation node trench), examples of which are found in U.S. Pat. Nos. 5,264,716, 5,360,758, and 5,555,520, and 5,614,431. MINT DRAM cell designs incorporate a buried strap in the storage node trench having an n+ outdiffusion in the single crystal silicon which points in a direction towards the channel of the access transistor.

Figure 1:
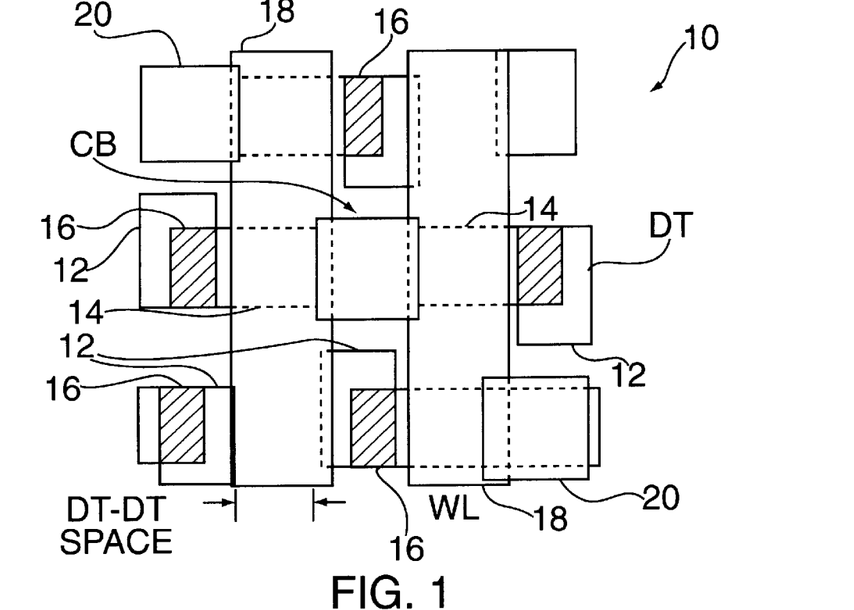
FIG. 1 is a top view showing the arrangement of elements within an array of 7 $F^2$ deep trench type dynamic random access memory (DRAM) cells.
Figure 2:
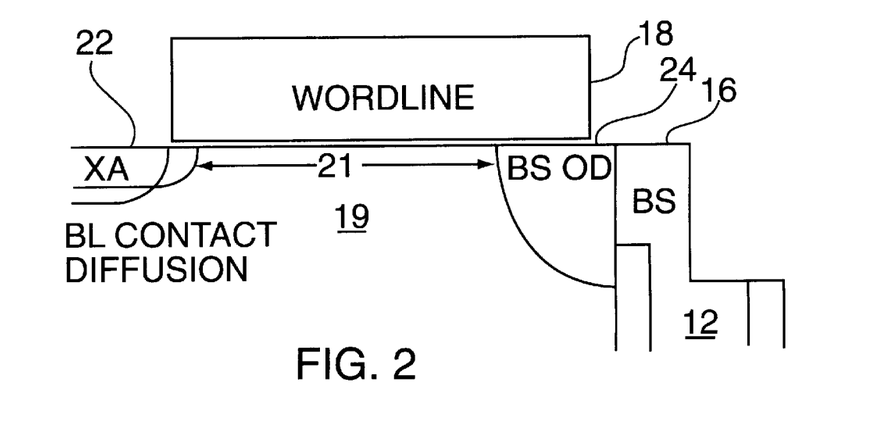
FIG. 2 is a cross-section view of a semiconductor substrate showing the arrangement of elements within a DRAM cell of the array shown in FIG. 1.

FIG. 1 is a top view showing the arrangement of elements within a MINT DRAM array 10 which has area of 7 $F^2$. Although examples of 7 $F^2$ DRAM cells are known in the art, the particular MINT DRAM array shown in FIGS. 1 and 2 is not admitted to be prior art. As shown in FIG. 1, deep trench storage capacitors 12 are linked to the active area (AA) 14 of a transistor by an outdiffusion from a buried strap 16 formed in the trenches 12. As shown in FIGS. 1 and 2, the gate conductors 18, utilized as wordlines (WLs), are placed in close proximity to the trenches 12. This close placement of the trench 12 to the gate conductor 18 results in overlap of the gate conductor 18 over the outdiffusion 24 from the buried strap 16 as also shown in cross-section in FIG. 2. This effect can cause the length 21 of the transistor channel 19 to be shorter than desired, resulting in lowered threshold voltage $V_T$, increased transistor off current $I_{off}$ and increased subthreshold voltage swing. Collectively, these effects can be described as "short channel effects." The short channel effects have an adverse impact on the retention time of the DRAM array. In order to meet the retention time objective, the conventional approach has been to increase doping concentration in the channel region to achieve a higher threshold voltage and reduced off current. However, the increased channel doping concentration results in increases in the junction leakage and substrate sensitivity of the transistor.

The article by T. Hamamoto et al., "Well Concentration: A Novel Scaling Limitation Factor Derived From DRAM Retention Time And Its Modeling," IEDM Technical Digest, Vol. 95, pp. 915–918 (1995) reports that high channel doping concentrations electrically activate defects in the single crystal silicon material of the transistor. As described in that article, crystal defects serve as generation centers for minority carriers which are collected by the storage node diffusion (analogous to the buried strap outdiffusion in the existing MINT DRAM cells). The increased carrier generation, notwithstanding its occurrence in only a small minority of the DRAM array, has a profound impact upon the retention time for the DRAM integrated circuit (IC). High channel doping concentration greatly increases the junction leakage, subthreshold voltage swing and the substrate sensitivity of the IGFET.

The article by T. Ozaki et al. entitled "0.228 um$^2$ Trench Cell Technologies with Bottle-Shaped Capacitor for 1 Gbit DRAMs," *IEDM Digest of Technical Papers,* 1995, pp. 661–664 ("the Ozaki et al. Article") describes a proposed DRAM cell design which has dimensions of 6$F^2$. That proposed cell design is similar to the deep trench DRAM cell designs described above in that the conductive path from the deep trench storage capacitor to the channel of the access transistor is essentially a straight line, except that the design described in the Ozaki et al. Article requires a surface strap rather than a buried strap.

In order to achieve the small cell size, the design described in the Ozaki et al. Article requires the edge of the deep trench storage capacitor to be placed very close to the gate conductor which controls the on-off switching of the transistor channel. The close proximity of the deep trench to the gate conductor leads to short channel effects, which, as described above, lead to lowered threshold voltage and increased transistor off current. In addition, any errors which occur in the positioning of masks which define the deep trench and the gate conductor (even those which are within overlay tolerances) can substantially decrease the channel width and/or prevent the surface strap between the deep trench and the channel from forming. Consequently, existing process tolerances place great obstacles to the implementation of the design described in the Ozaki et al. Article. Because of difficulty in maintaining control over the placement and dimensions of devices within existing process tolerances, the design described in the Ozaki Article results in a high probability of channel shortening effects. High channel doping concentrations, in turn, are required to overcome such short channel effects. However, a high channel doping concentration, as described above, is itself a source of undesirable device degradation.

As the integration density increases, the close proximity between the buried strap and the channel region in existing designs will require ever higher doping concentrations in order to meet $I_{off}$ and retention time objectives. However, as described above, such higher doping concentrations lead to undesirable device degradation, including increased subthreshold voltage swing, junction leakage, and substrate sensitivity.

One possible way of avoiding the requirement of a higher channel doping concentration would be to increase the physical length of the channel region, which of itself counteracts the above-described short channel effects, and permits a lower channel doping concentration to be used. U.S. Pat. No. 5,614,431 to DeBrosse, which is commonly assigned ("the '431 Patent"), describes one such DRAM cell in which the channel length is increased to 2 F. However, in that design the buried strap and the channel still remain in close proximity. Moreover, the minimum area required by the DRAM cell in the '431 Patent is 8 $F^2$, in contrast to competing 7 $F^2$ designs which offer a substantial reduction in area. The increased area occupied by the DRAM cell described in the '431 Patent weighs against the requirement to increase the integration density of the DRAM IC. Finally, the invention herein described can be implemented together with the increased channel length DRAM cell design described in the '431 Patent to provide a DRAM cell having improved operating characteristics by virtue of increased deep trench to gate conductor spacing provided by the invention.

Alternatively, a DRAM cell having larger storage capacitance, such as provided by a larger storage capacitor, could assist in meeting the retention time requirement. However, by existing DRAM designs, this could only be accomplished at expense of increasing the area required by the DRAM cell.

The need to provide increased integration density and to limit the channel doping concentration highlight a need for a DRAM cell design which requires no greater area, but in which the storage capacitor strap is placed further away from the channel of the transistor. In that way, the doping concentration in the channel can be reduced, thereby reducing junction leakage, subthreshold swing and substrate sensitivity, and improving retention time. Alternatively, a DRAM cell structure is needed which provides higher storage capacitance, but without increasing the amount of area occupied by the cell.

Accordingly, it is an object of the invention to provide an arrangement of memory cell elements on a semiconductor substrate in such manner that the distance between the outdiffusion of the storage capacitor strap and the transistor channel is increased without requiring an increase in area.

Another object of the invention is to provide a method of forming storage capacitor trenches within a semiconductor wafer such that the spacing between adjacent trenches is less than the minimum feature size F.

Still another object of the invention is to provide an arrangement of memory cell elements within a semiconductor memory array which accommodates larger storage capacitors without requiring a corresponding increase in the size of each memory cell. A particular object of the invention is to provide an arrangement of memory cell elements within a semiconductor memory array by which larger trench storage capacitors are accommodated by decreasing the spacing between adjacent trench storage capacitors to less than minimum feature size.

A further object of the invention is to provide a method of fabricating elements within a semiconductor memory array by which larger trench storage capacitors are accommodated by decreasing the spacing between adjacent trench storage capacitors to less than minimum feature size.

SUMMARY OF THE INVENTION

These and other objects are provided by the arrangement of memory cells and method of making of the present invention. Accordingly, in a first embodiment of the invention, a pure phase edge mask is used to define trench patterns in which the spacing between adjacent back-to-back trenches is reduced to below the minimum feature size F. The reduction in the trench-to-trench spacing results in increased separation between the trench and the near edge of the gate conductor. This increase in the trench to gate conductor spacing, in turn, permits the channel doping concentration to be decreased, with a corresponding increase in ON current.

In alternative embodiments, a pure phase edge mask or a blocked phase edge mask is used to define trench patterns in which the width of trenches is increased to form storage capacitors having higher capacitance. In such embodiments, the spacing between back-to-back trenches can be reduced, such that the total separation between the outer edges of adjacent trenches is maintained at about 3 F or less.

DETAILED DESCRIPTION OF THE PREFERRED EMBODIMENTS

Figure 3:
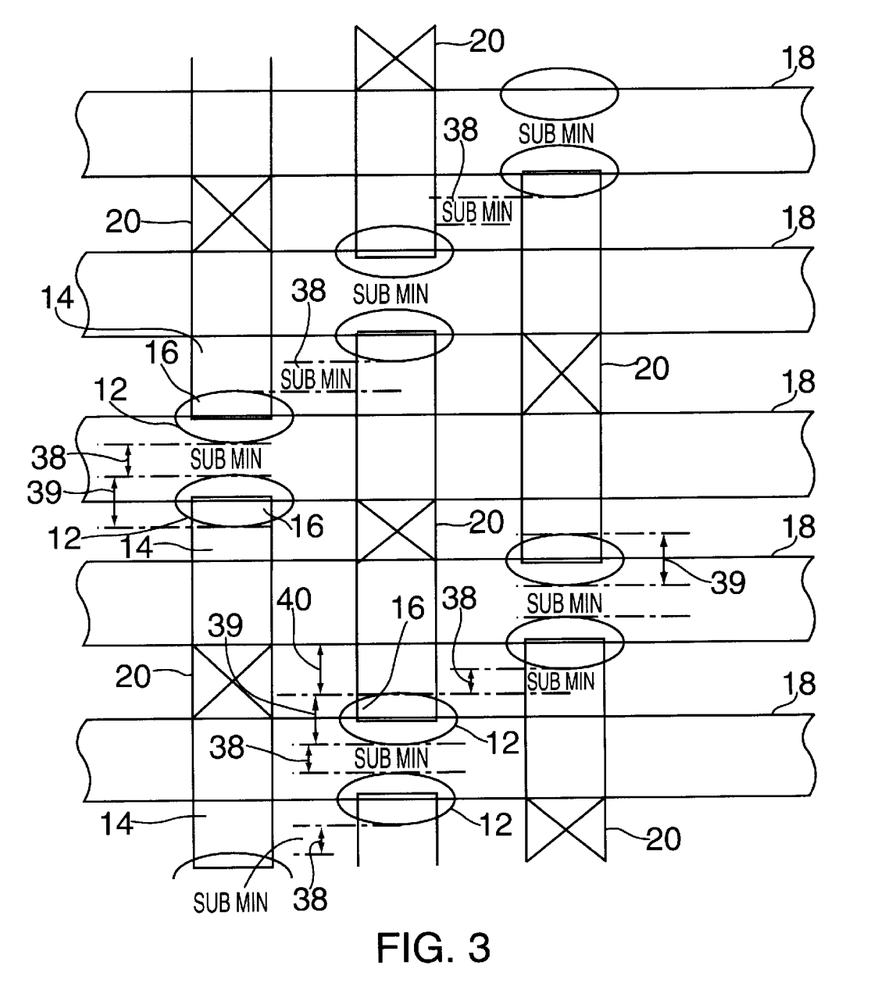
FIG. 3 shows a top view of a 7 square MINT DRAM array in which the spacing between adjacent storage capacitor trenches has been reduced to a spacing 38 of about 0.5 F.

FIG. 3 shows a top view of a first embodiment of 7 square MINT DRAM array in which the spacing between adjacent storage capacitor trenches 12 has been reduced to a spacing 38 of about 0.5 F. Because of the reduced trench-to-trench spacing 38, the spacing 40 between the buried strap 16 and the near edge of the gate conductor 18 is increased in relation to that buried strap 16 to gate conductor 18 spacing which exists with adjacent trenches at conventional 1.0 F spacing, without decreasing the width of the gate conductor (i.e. the wordline).

The present invention makes other variations of this basic arrangement possible, as well. In a second embodiment of the invention, the trench-to-trench spacing 38 is again reduced; however, the spacing 40 between the buried strap 16 and the gate conductor 18 is not reduced, but instead the width 19 of each trench 12 is increased in proportion to the reduced trench-to-trench spacing 38. Those skilled in the art will understand the further variations and enhancements of the invention which are made possible by reduction in the trench-to-trench spacing 38 and/or increase in the width 39 of the trenches 12.

Figure 4:
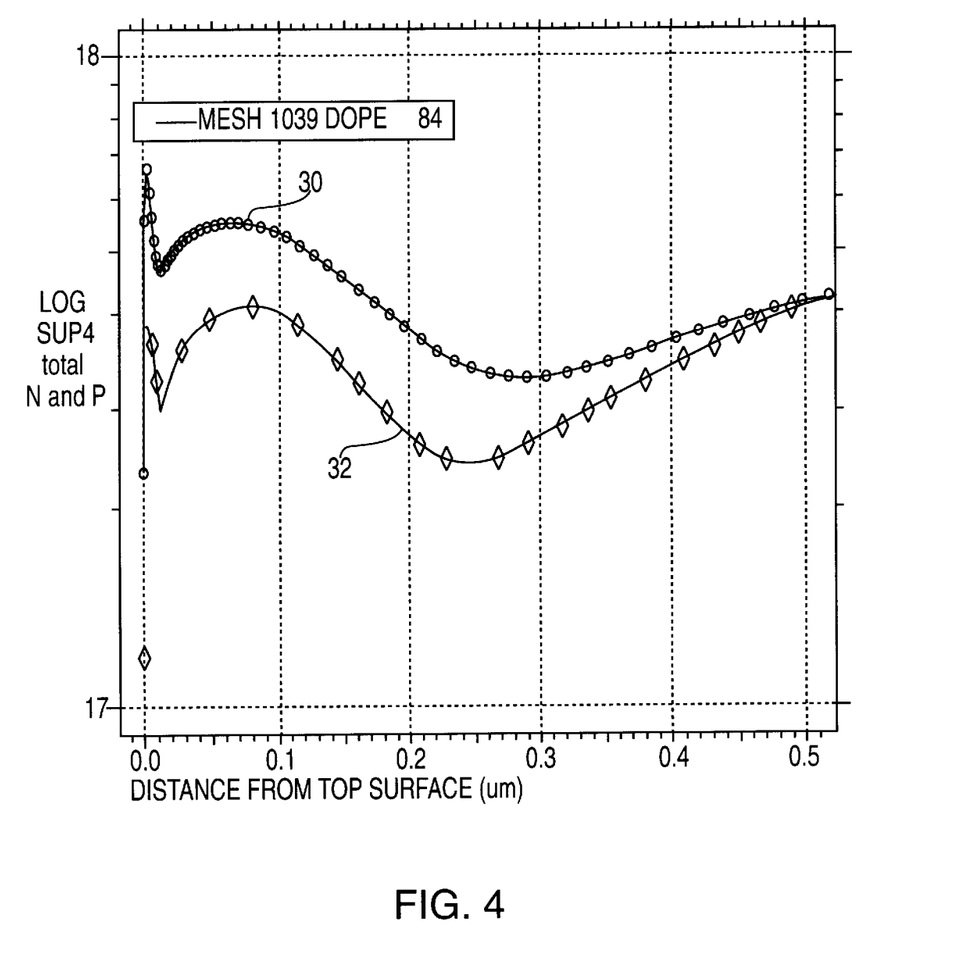
FIG. 4 contains graphs showing simulated vertical doping profiles for the p-wells of 7 $F^2$ MINT DRAM cells for two cases of different channel doping concentrations.

FIG. 4 contains graphs showing simulated vertical doping profiles for the p-wells of 7 square MINT DRAM cells for two cases. Curves 30 and 32 are vertical doping profiles obtained by T-SUPREM4 simulation (obtained from, and trademark of Technology Modeling Associates, Inc. of Sunnyvale, Calif.), as required to provide the following operating characteristics: subthreshold leakage current $I_{off}$ of about 0.5 fA at a gate to source voltage $V_{gs}$ of –0.9 V for the OFF condition. Curve 30 shows a vertical doping profile for the case in which the spacing between adjacent trench capacitors, defined by conventional lithographic methods, is about 1 F separation.

By contrast, curve 32 shows a vertical doping profile for a case in which the spacing between adjacent trench capacitors is reduced to about 0.5 F, by method of the present invention. By comparison of curves 30 and 32, it is apparent that the required peak doping concentration is reduced by about 30% for the case (curve 32) in which the spacing between adjacent trench capacitors is reduced to about 0.5 F.

Figure 5:
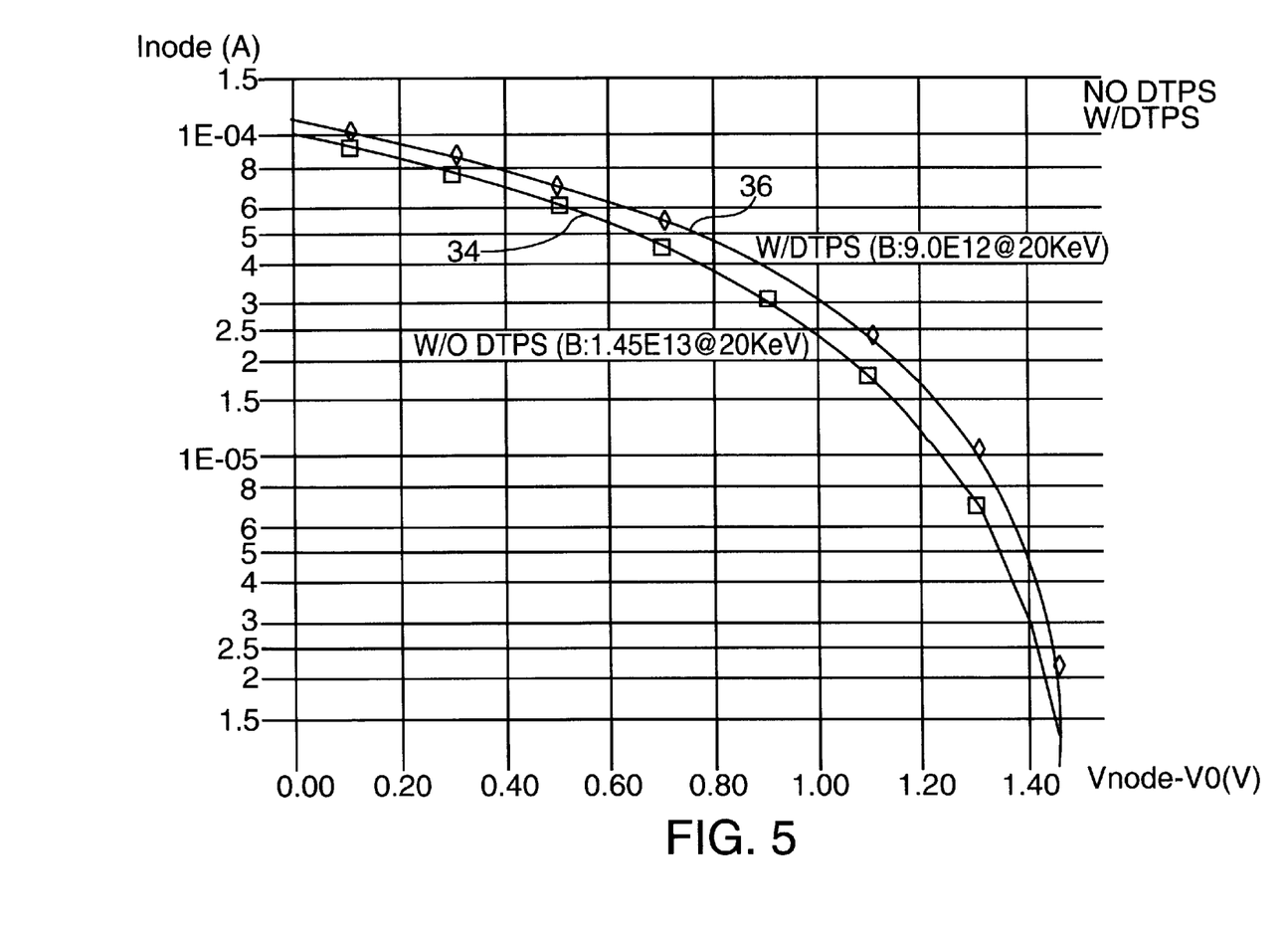
FIG. 5 contains curves 34, 36, showing simulated ON current—voltage characteristics ($I_{node}$v.$V_{node}$–V'0') for the ON condition for the current path between the storage capacitor and bitline contact to the access transistor for a 7 $F^2$ MINT DRAM cell for cases of different channel doping concentrations.

FIG. 5 contains curves 34, 36, showing the ON current—voltage characteristic ($I_{node}$ v. $V_{node}$–V'0') from the storage capacitor through the access transistor for a 7 square MINT DRAM cell for active writeback operations. Curve 34 shows the ON current voltage characteristic for the case in which adjacent trench storage capacitors are defined in the conventional manner with trench-to-trench spacing set to 1 F.

Curve 36 shows the ON current voltage characteristic for the case in which adjacent trench storage capacitors are defined by the method of the present invention with the trench-to-trench spacing set to about 0.5 F. For both curves 34, 36, the vertical doping profiles within the access transistors of the DRAM cells are set to the respective values shown in curves 30, 32 of FIG. 3. The reduced channel doping profile for the subminimum trench spacing case results in a 25% increase in channel ON current. This increase in ON current can be attributed to higher carrier mobility, reduced subthreshold swing and reduced substrate sensitivity due to the reduced channel doping profile.

Figure 6A:
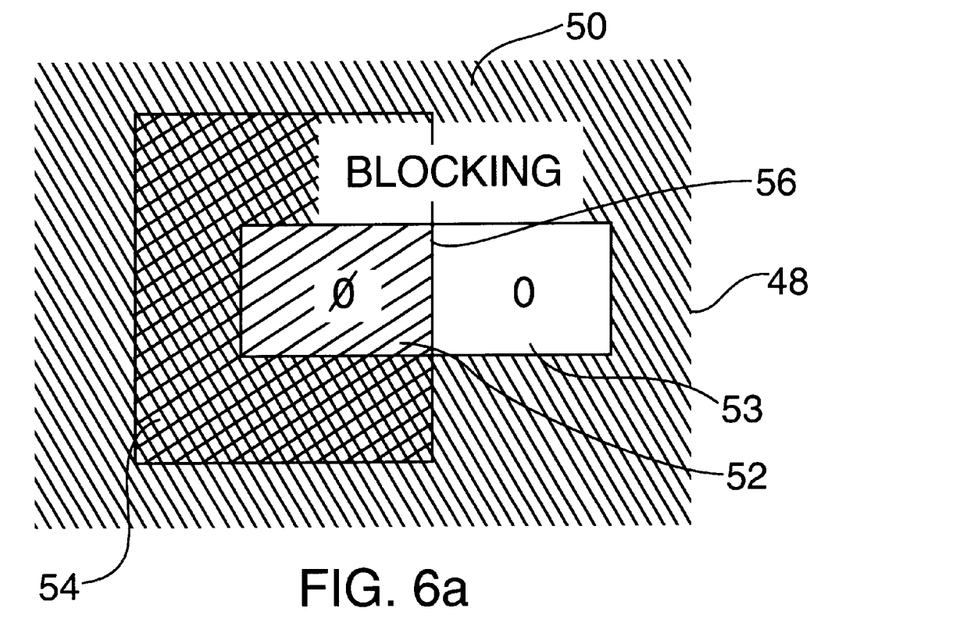
FIG. 6a is a diagram showing a top view of a portion of a phase shift mask 48 utilized in defining a reduced spacing DRAM array of the present invention.

FIG. 6a is a diagram showing a top view of a portion of a phase shift mask 48 utilized in defining the reduced spacing DRAM array in "pure phase edge" embodiments of the present invention. As shown in FIG. 6a, the mask 48 contains a radiation blocking layer 50 of a metal such as chrome which is patterned to form a radiation transmitting aperture including areas 52 and 53. Mask 48 operates as a pure phase edge shifting mask. A layer of phase shifting medium is patterned to form a phase shifting feature 54 which overlays phase shifted aperture area 52, but not area 53. Phase shifting feature 54 shifts the phase of radiation a predetermined amount, preferably 180 degrees, with respect to radiation that does not travel through phase shifting feature 54. This results in a phase difference of preferably 180 degrees between radiation which strikes the substrate after passing through areas 52 and 53.

Figure 6B:
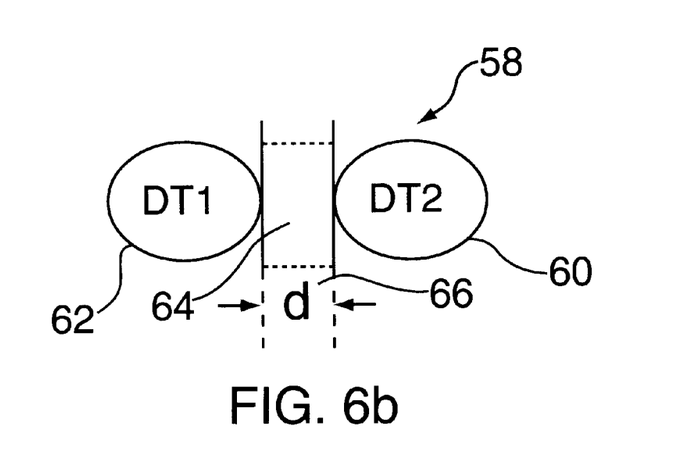
FIG. 6b is a diagram showing a pattern 58 which results from exposing a photoresist layer on a substrate through mask 48.

In a first embodiment of the invention, FIG. 6b is a diagram showing a pattern 58 which results from exposing a photoresist layer on a substrate through the mask 48. Because of interference between the radiation transmitted through aperture 52, both through phase shifting feature 56 and that which does not, the photoresist layer is exposed in trench defining areas 60, 62, while not exposed in area 64 between the trench defining areas 60, 62. Because of the resolution of the wavelength used, and the direct juxtaposition of the phase shifted aperture area 52 with the non-phase shifted aperture area 53, with no intervening blocking layer 50, the resulting distance d, 66 between exposed trench-defining resist patterns 60, 62 is smaller than the minimum feature size F. It will be understood that with appropriate process control, the distance d, 66 between trench-defining resist patterns 60, 62, can be tailored to a desired value ranging from about 0.35 F to 0.70 F, depending upon the exposure dose and the sensitivity of the resist, with 0.5 F being a preferred spacing with the pure phase edge method.

Figure 7:
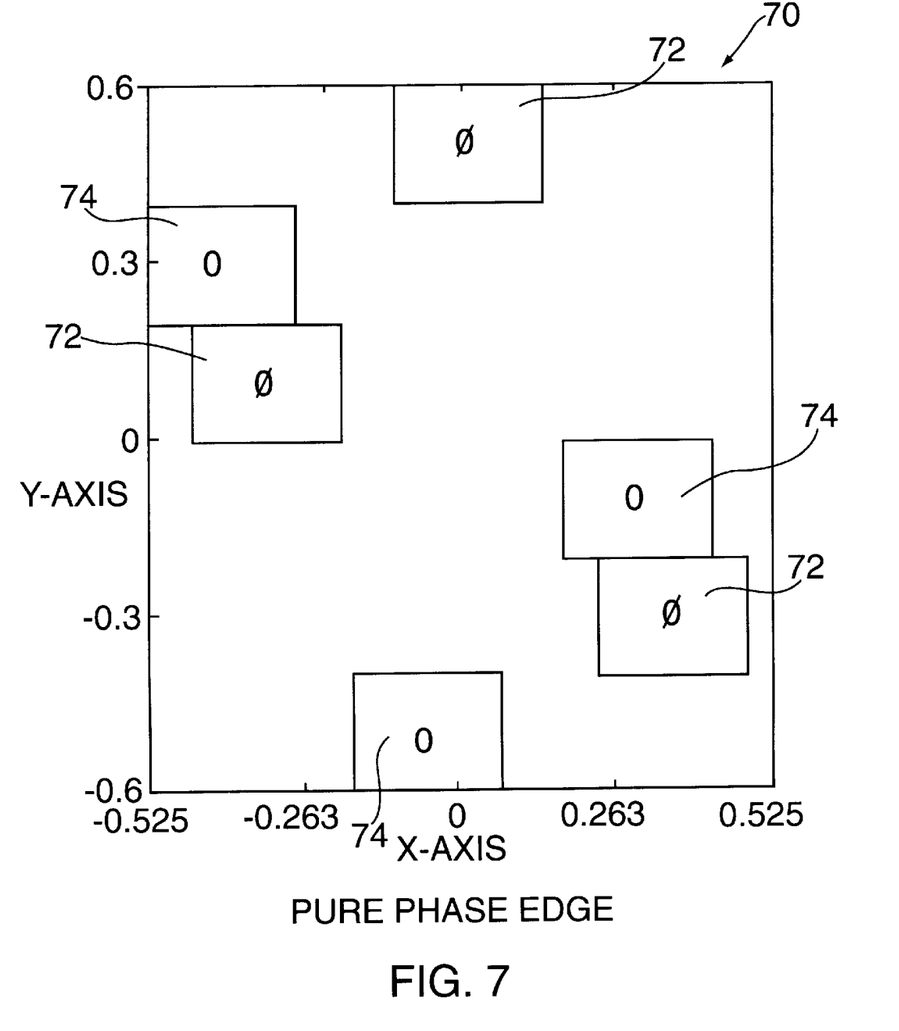
FIG. 7 is a diagram showing phase-shifted and non-phase shifted aperture areas 72, 74 of a pure phase edge mask 70.
Figure 8:
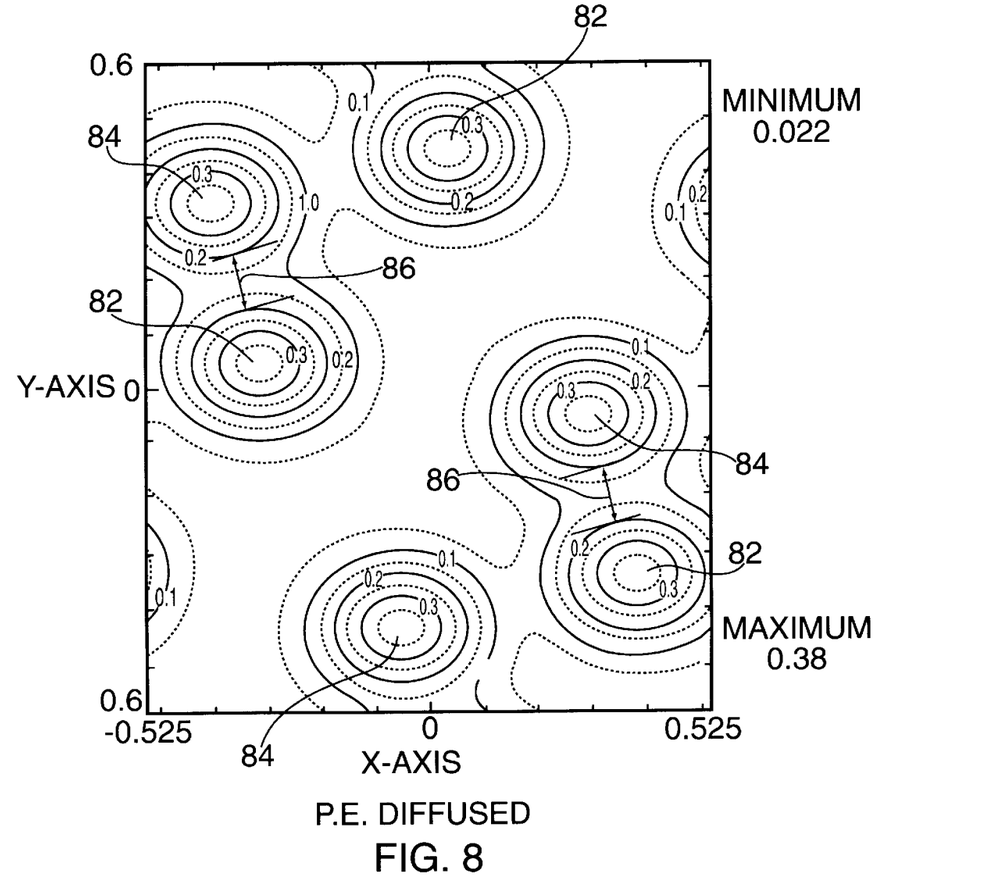
FIG. 8 shows a simulated exposure pattern which results from exposure of a photoresist layer to radiation through pure phase edge mask 48.

Again, with respect to a first embodiment of the invention, FIG. 7 is a diagram showing phase-shifted and non-phase shifted aperture areas 72, 74 of a pure phase edge mask 70, for producing a DRAM memory cell array with the spacing between trench storage capacitors reduced to less than the minimum feature size F. In this example, the minimum feature size F is 0.175 microns. FIG. 8 shows a simulated exposure pattern which results from exposure of a photoresist layer to radiation through mask 48. Areas 82 are exposed resist trench patterns defined by phase shifted areas 72 of mask 70. Areas 84 are exposed resist trench patterns defined by non-phase shifted areas 74 of mask 70. The contours labelled "0.2" in FIG. 8 show places in the resist pattern which have received the same dose, and thus form the edges of the trench patterns which will be etched. As is known, the overall extent of the resist contours can be tailored by varying the exposure dose and the sensitivity of the resist. As shown in FIG. 8, the separation, 86, between adjacent the 0.2 contours of resist exposure patterns 82, 84 is much less than 1 F, and is approximately 0.09 microns (about ½ F).

With respect to FIG. 3, in a second embodiment of the invention, adjacent trenches 12 are defined with a reduced trench-to-trench spacing 38, but increased trench width 39. Accordingly, a reduction in the spacing between the edge of the trench 12 and the gate conductor 18 may or may not be realized. However, the increased trench width 39 increases the capacitance of the storage capacitor formed therein to provide increased protection against large off current $I_{off}$ or large junction leakage.

With appropriate exposure dose control and selection of resist sensitivity, a pure phase edge mask 70 can be used to define the required resist pattern for the second embodiment. In order to define increased width trenches of 1.× F width while defining a spacing 38 below 1.0 F, adjoining trench apertures 72 and 74 of mask 70 can be increased in size above 1.0 F.

The total edge-to-edge separation which results between the outer edges of adjacent enlarged width trenches, can by appropriate design, be tailored to desired values from below 3.0 F and above. By defining larger trench storage capacitors, higher capacitance nodes can be provided. With higher capacitance nodes, higher $I_{off}$ can be tolerated, thus permitting the channel doping concentration to be reduced and helping to avoid the foregoing described secondary effects of high channel doping.

Figure 9:
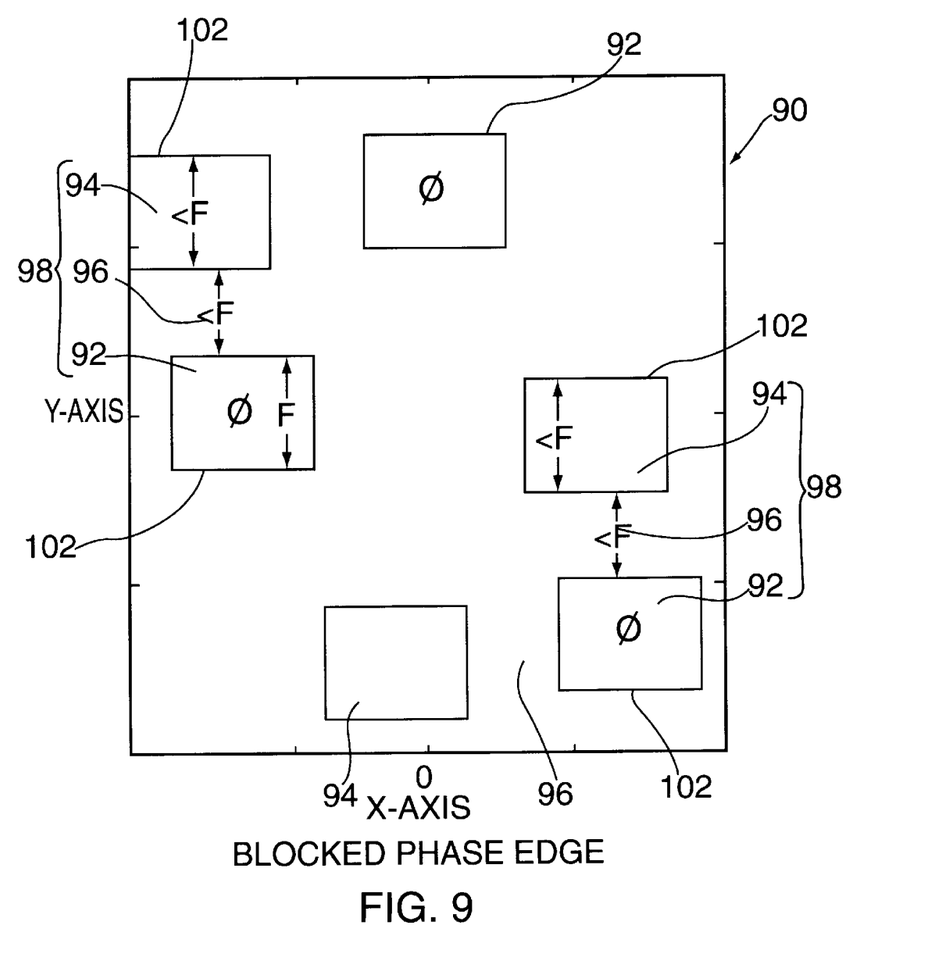
FIG. 9 is a diagram showing phase-shifted and non-phase shifted aperture areas 92, 94 of a blocked phase edge mask 90.

In a third embodiment of the invention an alternative method is used to form patterns for adjacent trenches in which the trench-to-trench spacing 38 is reduced and the trench width 39 is increased. FIG. 9 is a diagram showing phase-shifted and non-phase shifted aperture areas 92, 94 of a blocked phase edge mask 90 used to define trench patterns in this embodiment. The blocked phase edge mask 90 permits trench patterns to be defined in which the width 39 of the storage capacitor trenches 12 (in the direction towards the bitline contacts 20) is increased. At the same time, the spacing 38 between back-to-back trenches is decreased to less than 1 F, resulting in a DRAM cell having increased capacitance, but occupying no greater area than existing DRAM cells.

The blocked phase edge mask 90 contains aperture areas 92, 94 which are spaced with respect to each other by blocking layer material 96 having width of less than 1 F. Aperture areas 92, 94 may also have width of less than 1 F. Aperture areas 92, 94 are provided with phase-shifting layers such that a phase difference of preferably 180 degrees is achieved between radiation which is transmitted through aperture areas 92 and 94.

Use of the blocked phase edge mask 90 (FIG. 9) in conjunction with appropriate exposure dose and control over resist sensitivity results in a photoresist exposure pattern in which trench storage capacitors defined thereby are enlarged to a size greater than the minimum feature size F, while the separation between adjacent trench storage capacitors is reduced to less than 1 F. The total edge-to-edge separation which results between the outer edges of adjacent trenches, can by appropriate design, be tailored to values about 3 F and above. As noted above, the larger trench storage capacitors defined according to this third embodiment result in higher capacitance nodes which permit higher $I_{off}$ to be tolerated.

While the invention has been described in accordance with certain preferred embodiments thereof, those skilled in the art will recognize the many modifications and enhancements which can be made without departing from the true scope and spirit of the appended claims.

What is claimed is:

1. An arrangement of semiconductor memory cells, each memory cell comprising:

a trench storage capacitor separated from an adjacent trench storage capacitor by a spacing S, said spacing S being smaller than a minimum feature size F for photolithographically defining features of said memory cells; and an insulated gate field effect transistor (IGFET), said IGFET having a gate conductor, a channel region underlying said gate conductor, and first and second source-drain regions flanking said gate conductor, said first source-drain region located on a side near said trench storage capacitor;

a strap conductively connecting said trench storage capacitor to said first source-drain region wherein a separation between said strap and said gate conductor is increased in proportion to the difference F–S between said minimum feature size F and said spacing S.

2. The memory cell arrangement of claim 1 wherein said storage capacitor is formed in a trench and said strap includes a region of ions outdiffused from within said trench.

3. The memory cell arrangement of claim 2 wherein said IGFET is formed in a region of monocrystalline semiconductor and said ions are outdiffused from said trench in a direction toward said channel region.

4. The memory cell arrangement of claim 3 wherein doping of said channel region is of the p conductivity type.

5. The memory cell arrangement of claim 3 wherein doping of said channel region is of the n conductivity type.

6. The memory cell arrangement of claim 4 wherein said gated channel region of said IGFET has a surface doping concentration of approximately $8 \times 10^{17}$ cm$^{-3}$ doping impurity atoms or less.

7. The semiconductor memory cell of claim 6 wherein said IGFET is of the n-channel insulated gate (IGFET) type and has an off current $I_{off}$ of approximately 100 femtoamperes ($100 \times 10^{-15}$ A) or less when said IGFET is biased at a gate-source voltage of approximately $V_{gs}-V_T=0.0$ volts.

8. The memory cell arrangement of claim 6 wherein said gated channel region of said IGFET has a surface doping concentration of approximately $5 \times 10^{17}$ cm$^{-3}$ doping impurity atoms to provide an off current $I_{off}$ level of about 0.5 fA when said IGFET is biased at a gate-source voltage of approximately $-0.9$ V.

9. The semiconductor memory cell of claim 6 wherein said cell occupies an area of eight square minimum feature size or less and said IGFET delivers a current of approximately 1 microampere ($1 \times 10^{-6}$ A) or greater while charging said storage capacitor from a bitline low level voltage to a bitline high level voltage.

10. An enhanced storage capacitance semiconductor memory cell of an array of memory cells, comprising:

a storage capacitor having width substantially greater than minimum feature size F, said storage capacitor separated from an adjacent storage capacitor of an adjacent memory cell by a spacing S, wherein said spacing S is smaller than said minimum feature size F, such that said storage capacitor, said adjacent storage capacitor, and said spacing S have a combined width of approximately 3 F or less; and an access device coupled to said storage capacitor.

11. The semiconductor memory cell of claim 10 wherein said access device is an insulated gate field effect transistor (IGFET).

12. An array of semiconductor memory cells, comprising:

a plurality of memory cells, each memory cell comprising a trench storage capacitor and an access transistor; and gate conductors controlling on-off switching of said access transistors, wherein trench storage capacitors of adjacent memory cells are separated by a spacing S of less than 1 F, where F is the minimum feature size.

13. The array of semiconductor memory cells of claim 12 wherein said trench storage capacitors of said adjacent memory cells have width greater than 1 F.

14. The array of semiconductor memory cells of claim 13 wherein said trench storage capacitors of said adjacent memory cells have outer edges separated by about 3 F.

* * * * *